(12) United States Patent  
Ohsawa et al.

(10) Patent No.: US 9,082,961 B2  
(45) Date of Patent: Jul. 14, 2015

(54) METHOD OF MANUFACTURING MULTILAYER FILM

(75) Inventors: Yuichi Ohsawa, Yokohama (JP); Shigeki Takahashi, Yokohama (JP); Junichi Ito, Yokohama (JP); Daisuke Saida, Fuchu (JP); Kyoichi Suguro, Yokohama (JP); Hiroaki Yoda, Sagamihara (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 676 days.

(21) Appl. No.: 13/226,960

(22) Filed: Sep. 7, 2011

(65) Prior Publication Data

US 2012/0244640 A1    Sep. 27, 2012

(30) Foreign Application Priority Data

Mar. 22, 2011    (JP) .................. 2011-063285

(51) Int. Cl.
*H01L 43/12*    (2006.01)
*H01L 29/82*    (2006.01)

(52) U.S. Cl.
CPC .................. *H01L 43/12* (2013.01); *H01L 29/82* (2013.01)

(58) Field of Classification Search
None
See application file for complete search history.

(56) References Cited

U.S. PATENT DOCUMENTS

| | | | |
|---|---|---|---|
| 2002/0070361 A1* | 6/2002 | Mack et al. | 250/505.1 |
| 2004/0080876 A1* | 4/2004 | Sugita et al. | 360/324.2 |
| 2006/0043317 A1* | 3/2006 | Ono et al. | 250/492.21 |
| 2008/0122005 A1 | 5/2008 | Horsky et al. | |
| 2009/0191696 A1* | 7/2009 | Shao et al. | 438/511 |
| 2010/0183902 A1* | 7/2010 | Kim et al. | 428/811.1 |
| 2011/0159316 A1* | 6/2011 | Wang et al. | 428/800 |
| 2011/0174770 A1* | 7/2011 | Hautala | 216/13 |
| 2013/0099338 A1 | 4/2013 | Nakayama et al. | |

FOREIGN PATENT DOCUMENTS

| | | |
|---|---|---|
| JP | 4-241481 A | 8/1992 |
| JP | 9-41138 A | 2/1997 |
| JP | 2004-6589 | 1/2004 |
| JP | 2006-510196 A | 3/2006 |
| JP | 2007-305610 A | 11/2007 |
| JP | 2008-66612 A | 3/2008 |
| JP | 2008-522429 A | 6/2008 |
| WO | WO 2005/088745 A1 | 9/2005 |

OTHER PUBLICATIONS

U.S. Appl. No. 13/231,894, filed Sep. 13, 2011, Takahashi, et al.
Japanese Office Action Issued Mar. 19, 2013 in Patent Application No. 2011-063285 (with English translation).
U.S. Appl. No. 14/200,742, filed Mar. 7, 2014, Toko.
U.S. Appl. No. 14/200,670, filed Mar. 7, 2014, Sugiura.
U.S. Appl. No. 14/202,802, filed Mar. 10, 2014, Nakayama.
U.S. Appl. No. 14/203,249, filed Mar. 10, 2014, Nakayama.

* cited by examiner

*Primary Examiner* — Alexander Ghyka
(74) *Attorney, Agent, or Firm* — Oblon, McClelland, Maier & Neustadt, L.L.P.

(57) ABSTRACT

According to one embodiment, a method of manufacturing a multilayer film, the method includes forming a first layer, forming a second layer on the first layer, and transcribing a crystal information of one of the first and second layers to the other one of the first and second layers by executing a GCIB-irradiation to the second layer.

24 Claims, 8 Drawing Sheets

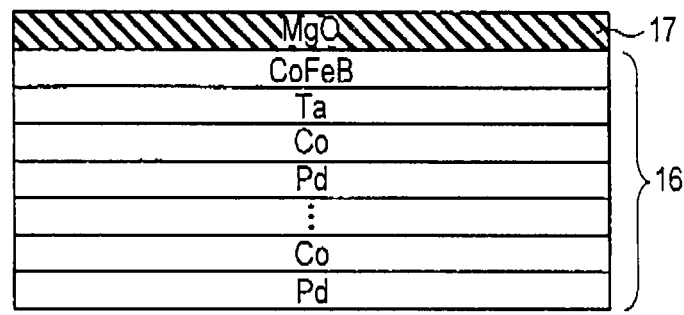
F I G. 2
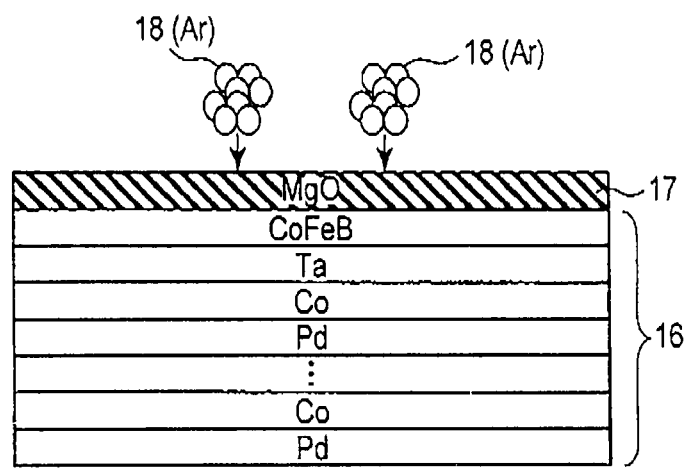
F I G. 3
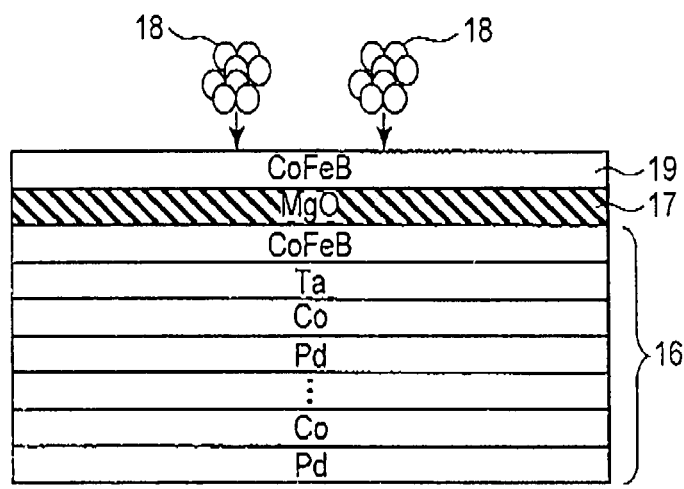
F I G. 4

METHOD OF MANUFACTURING MULTILAYER FILM

CROSS-REFERENCE TO RELATED APPLICATIONS

This application is based upon and claims the benefit of priority from prior Japanese Patent Application No. 2011-063285, filed Mar. 22, 2011, the entire contents of which are incorporated herein by reference.

FIELD

Embodiments described herein relate generally to a method of manufacturing a multilayer film.

BACKGROUND

In the past, applying a magnetic field has been known as a method for controlling a magnetization of a magnetic material. For example, in a hard disk drive (HDD), a magnetization of a medium is reversed by a magnetic field generated by a magnetic head to execute a write-in. In a conventional magnetic random access memory (MRAM), a magnetization of a cell is controlled by applying to a cell a current-induced magnetic field generated by causing a current to flow in lines provided near a magnetoresistive element. The current-induced magnetic field writing method for controlling a magnetization with external magnetic fields as explained above has a long history, and thus is the established technology.

On the other hand, along with the recent progress in nanotechnology, magnetic materials can be made into significantly finer sizes. Accordingly, magnetization control has to be done locally on a nanoscale. However, localizing a magnetic field is difficult because a magnetic field fundamentally spreads spatially. This causes a significant crosstalk problem. Even when a particular storage unit region (bit) or a memory cell is selected to control its magnetization, a magnetic field spreads to adjacent bits or memory cells due to the finer sizes of the bits and memory cells. On the other hand, if a magnetic field generation source is made small to localize a magnetic field, there is a problem in that sufficient magnetic fields cannot be generated to control the magnetization. As a technique for solving these problems, the "spin injection-induced magnetization reversing method" is known, in which a current is passed through a magnetic material to induce magnetization reversal.

In this spin injection-induced magnetization reversing method, a spin injection current serving as a write current is passed through a magnetoresistive element to generate spin-polarized electrons, which are used for magnetization reversal. Specifically, the angular momentum of spin-polarized electrons is transferred to electrons in a magnetic material serving as a magnetic recording layer, and thereby the magnetization of the magnetic recording layer is reversed.

This spin injection-induced magnetization reversing method facilitates locally controlling magnetization states on the nanoscale, and the value of the spin injection current can be decreased in accordance with the finer size of the magnetic material. This facilitates realizing spin electronic devices such as hard disk drives and magnetic random access memories with high recording densities.

For example, the magnetic random access memory includes, as a storage device, a magnetoresistive element having an MTJ (Magnetic Tunnel Junction) film using the Tunneling Magnetoresistive (TMR) effect. The MTJ film includes three layers of thin films including a recording layer and a reference layer made of a magnetic material, and a tunnel barrier layer sandwiched therebetween. The MTJ film stores information using magnetization states of the recording layer and the reference layer. In a spin injection type MRAM using the spin injection-induced magnetization reversing method, information is written to a magnetoresistive element by passing a current in a direction perpendicular to the film surface of the MTJ film.

In order to read a signal with a lower power consumption, it is necessary to increase a reproduced signal, i.e., raise an MR ratio. When spin injection magnetization reversal recording is performed with a current, magnetoresistive (MR) reproduction is performed with the same current. Therefore, it is important to further raise the MR ratio. In order to raise the MR ratio in the TMR, an MgO barrier film requires a high degree of crystal perfection, and in order to increase the current margin, magnetic films are needed at either side of the barrier film. In general, in order to improve the crystal perfection, a so-called annealing process is usually used to give lattice vibration and return atoms to their original positions.

However, in annealing processes such as oven, hot plate, and infrared light radiation methods, lattice vibration is given to all multilayer films, and as a result, this causes interdiffusion. For example, it is reported that, when the annealing process is performed on CoFeB/MgO/CoFeB multilayer films at 350 to 400° C., B (boron) is diffused in MgO. This diffusion scatters electrons conducting in the MgO, and this causes a reduction in the MR ratio. Further, this annealing process causes interdiffusion among other magnetic multilayer films, which may reduce perpendicular magnetic anisotropy to result in deterioration of recording characteristics.

Therefore, a manufacturing method is desired to apply lattice vibration to only a particular layer within the multilayer films to improve the crystallinity of the particular layer without giving lattice vibration to other layers.

BRIEF DESCRIPTION OF THE DRAWINGS

FIGS. 1A to 1G and 2 to 4 show a manufacturing method of a first embodiment.

DETAILED DESCRIPTION

Figure 1A:
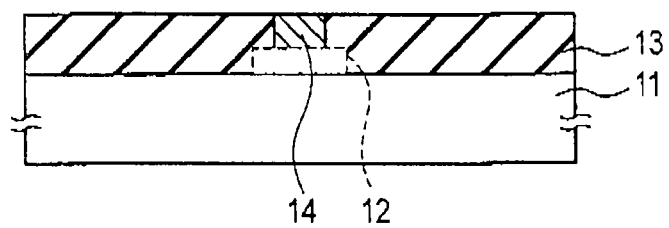

In general, according to one embodiment, a method of manufacturing a multilayer film, the method comprising: forming a first layer; forming a second layer on the first layer; and transcribing a crystal information of one of the first and second layers to the other one of the first and second layers by executing a GCIB-irradiation to the second layer.

The GCIB-irradiation is defined by an irradiation using gas clusters each comprising one or more kind of elements. The crystal information includes a crystal structure and a crystal orientation.

In the explanation below, elements having the same function and configuration will be denoted with the same reference numerals, and they are explained repeatedly only when necessary.

[Basic Configuration]

A method for manufacturing a multilayer film according to an embodiment suggests a technique for laminating a second layer on a first layer and thereafter transcribing crystal information of one of the first and second layers to the other one of the first and second layers by executing a GCIB-irradiation (gas cluster ion beam irradiation) to a surface of the second layer.

When the GCIB-irradiation is performed on the surface of the second layer, atomic arrangements in the first and second layers are affected by each other, and the atomic arrangement of one of the first and second layers is changed. Further, interdiffusion of atoms does not occur in layers other than the first and second layers, e.g., a layer serving as a ground for the first and second layers. Therefore, this improves characteristics of the multilayer film.

For example, when the first layer is a magnetic layer (such as CoFeB layer) and the second layer is a nonmagnetic layer (such as MgO layer), crystal information of the second layer is transcribed to the first layer. On the other hand, when the first layer is a nonmagnetic layer (such as MgO layer) and the second layer is a magnetic layer (such as CoFeB layer), crystal information of the first layer is transcribed to the second layer.

Incidentally, clusters used in the GCIB-irradiation may include atoms constituting the second layer or may include atoms constituting the second layer and other atoms different from those atoms. Further, the GCIB-irradiation may be a combination of multiple ion-beam irradiations each using a different cluster.

For example, when the second layer is an MgO layer, the GCIB-irradiation may be performed using a cluster having a structure in which an O atom is enclosed by Ar atoms. On the other hand, when the second layer is an MgO layer, the GCIB-irradiation may include the first irradiation using a cluster including Ar atoms and the second irradiation using a cluster including O atoms which are performed after the first irradiation.

In either case, the O atoms easily detached from the MgO layer serving as the second layer by the GCIB-irradiation can be compensated with the clusters including the O atoms, and a composition of the MgO layer can be maintained at an optimum value. When a cluster having a structure in which an O atom is enclosed by Ar atoms is used, the energy generated by the cluster colliding with the MgO layer increases, which allows efficient supply of the O atoms.

The methods for manufacturing multilayer films according to embodiments are significantly effective when both of the first and second layers have a thickness of 10 nm or less.

In the methods for manufacturing multilayer films according to embodiments, the following technique is suggested. When the second layer is formed on the first layer and a third layer is formed on the second layer, crystal information of the second layer is transcribed to the first and third layers by performing a GCIB-irradiation on the surface of the third layer.

When the GCIB-irradiation is performed on the surface of the third layer, atomic arrangements in the first to third layers are affected by each other, and the atomic arrangements of the first and third layers are changed. Further, interdiffusion of atoms does not occur in layers other than the first to third layers. Therefore, this improves characteristics of the multilayer film.

It should be noted that N×A is preferably larger than $1 \times 10^{17}$ cm$^{-2}$ so as to accelerate crystallization of only a particular layer within a multilayer film. In this case, N is the total number of clusters used in the GCIB-irradiation, and A is the average atomic number of a cluster.

According to the above basic configuration, lattice vibration is given to only a particular layer within a multilayer film so as to improve the characteristics of the multilayer film. For example, when the multilayer film constitutes a magnetoresistive element, the following advantages can be obtained by applying the embodiments: improvement of an MR ratio of a magnetoresistive element, lower write currents, improvement of reliability, improvement of yields due to a large process window, lower manufacturing cost, and the like.

[First Embodiment]

FIGS. 1A to 1G show a manufacturing method of a first embodiment.

This manufacturing method relates to a manufacturing method of a magnetoresistive element.

First, as shown in FIG. 1A, device 12 is formed on semiconductor substrate 11. Device 12 includes a switch device such as a MOS transistor and a conductive line such as an FEOL (Front End of Line). Further, inter-layer insulating film 13 is formed on the device 12, and contact plug 14 reaching device 12 is formed in inter-layer insulating film 13.

Thereafter, the upper surface of inter-layer insulating film 13 is planarized by CMP (Chemical Mechanical Polishing) and etch back. For example, inter-layer insulating film 13 is silicon oxide ($SiO_2$), and for example, contact plug 14 is tungsten (W).

Figure 1B:
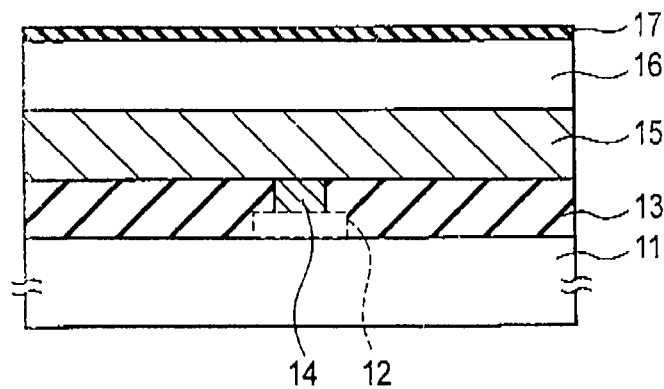

Subsequently, as shown in FIG. 1B, for example, using a sputtering method, underlayer 15, magnetic recording layer (magnetism free layer) 16, and tunnel barrier layer 17 are successively formed on contact plug 14.

For example, underlayer 15 is a layer needed to arrange the magnetization of magnetic recording layer 16 in a direction perpendicular to the film surface (the upper surface of the underlayer).

In this case, FIG. 2 and FIG. 3 illustrate an example of magnetic recording layer 16 of FIG. 1B in detail.

In this example, magnetic recording layer 16 includes a structure made by laminating six sets of layers including Pd (0.4 nm in thickness) and Co (0.4 nm in thickness), and also includes Ta (0.3 nm in thickness) and CoFeB (1 nm in thickness) on this structure. For example, tunnel barrier layer 17 has a body-centered cubic lattice (BCC) structure, and comprises an MgO layer (1 nm in thickness) oriented in the (001) face. Then, a GCIB (gas cluster ion beam) irradiation is performed on the surface of the MgO layer serving as tunnel barrier layer 17. However, the total number of clusters N is, for example, $1 \times 10^{14}$ cm$^{-2}$, and the average atomic number A of clusters is, for example, 10000. For example, N×A is $1 \times 10^{18}$ cm$^{-2}$.

For example, the clusters used in the GCIB-irradiation are Ar clusters 18, and they are ion-beam-irradiated at an acceleration voltage of, for example, 5 kV. At this occasion, the average energy per atom is 0.5 eV.

This GCIB-irradiation accelerates crystallization of CoFeB, and as a result, the CoFeB has the same crystal structure as MgO. In other words, for example, CoFeB has the body-centered cubic lattice (BCC) structure, and changes into a crystal structure oriented in the (001) face. Since the CoFeB is in a micro crystallite state or amorphous state before the GCIB-irradiation, it is understood that the crystal information of MgO is transcribed to CoFeB immediately thereunder by this irradiation.

At this occasion, no interdiffusion is observed in a Pd/Co multilayer film.

Figure 1C:
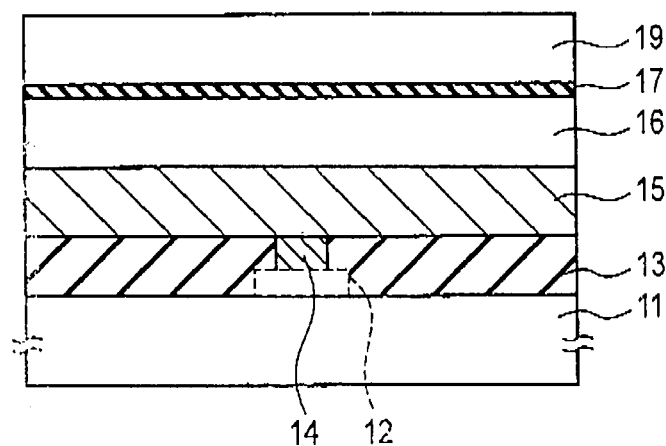

Subsequently, as shown in FIG. 1C, for example, using a sputtering method, magnetism reference layer (pinned layer) 19 is formed on tunnel barrier layer 17.

At this occasion, FIG. 4 illustrates an example of magnetic recording layer 16 and magnetism reference layer 19 of FIG. 1B in detail. For example, magnetism reference layer 19 includes CoFeB (1 nm in thickness). A GCIB-irradiation is performed on the surface of the CoFeB serving as magnetism reference layer 19. However, the total number of clusters N is, for example, $1 \times 10^{14}$ cm$^{-2}$, and the average atomic number A of clusters is, for example, 10000. For example, N×A is $1 \times 10^{18}$ cm$^{-2}$.

For example, the clusters used in the GCIB-irradiation are Ar clusters 18, and they are ion-beam-irradiated at an acceleration voltage of, for example, 5 kV. At this occasion, the average energy K per atom is 0.5 eV (=5 kV/10000).

This GCIB-irradiation accelerates crystallization of the CoFeB, and as a result, the CoFeB has the same crystal structure as MgO. In other words, for example, CoFeB has the body-centered cubic lattice (BCC) structure, and changes into a crystal structure oriented in the (001) face. Since the CoFeB is in a micro crystallite state or amorphous state before the GCIB-irradiation, it is understood that the crystal information of MgO is transcribed to CoFeB immediately thereabove by this irradiation.

At this occasion, no interdiffusion is observed in the Pd/Co multilayer film, either.

The GCIB clusters may be not only Ar but also rare gases such as Ne, Kr and Xe. The average atomic number A of atoms constituting a cluster is preferably 500 or more, and further, the energy K per atom is preferably 1 eV or less, so as not to introduce damage to the ion-irradiation face. Further, in order to give an annealing effect, a product (N×A) of the irradiation concentration N of the cluster and the average atomic number A of atoms constituting the cluster is preferably $1 \times 10^{17}$ cm$^{-2}$ or more. However, the effects of the present embodiment can also be achieved by increasing K to more than 1 eV and performing the GCIB-irradiation while generating etching on the film surface. At that occasion, an initial film thickness needs to be thicker than a design value.

It should be noted that thereafter Ta (4 nm in thickness), Co (4 nm in thickness), and Pt (6 nm in thickness)/Co (4 nm in thickness) may be further laminated as magnetism reference layer 19, so that the magnetic bias of the magnetoresistive element may be adjusted.

Figure 1D:
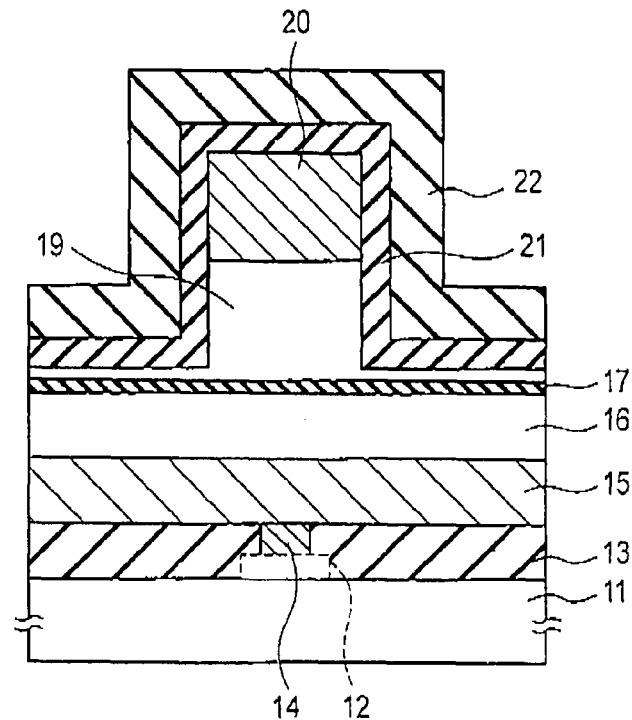

Subsequently, as shown in FIG. 1D, for example, using a sputtering method, electrode layer 20 is formed on magnetism reference layer 19. For example, electrode layer 20 includes a tantalum (Ta) layer.

After a photoresist layer is formed on electrode layer 20, electrode layer 20 is etched using the photoresist layer as a mask, and a resist pattern is transcribed to electrode layer 20. Thereafter, using electrode layer 20 as a mask, for example, magnetism reference layer 19 is etched by ion milling. Subsequently, for example, insulating layers 21 and 22 are formed to cover magnetism reference layer 19 and electrode layer 20. When magnetism reference layer 19 includes multiple layers, insulating layers 21 and 22 are attached to its side surfaces without any space formed between side surfaces of the respective layers.

Figure 1E:
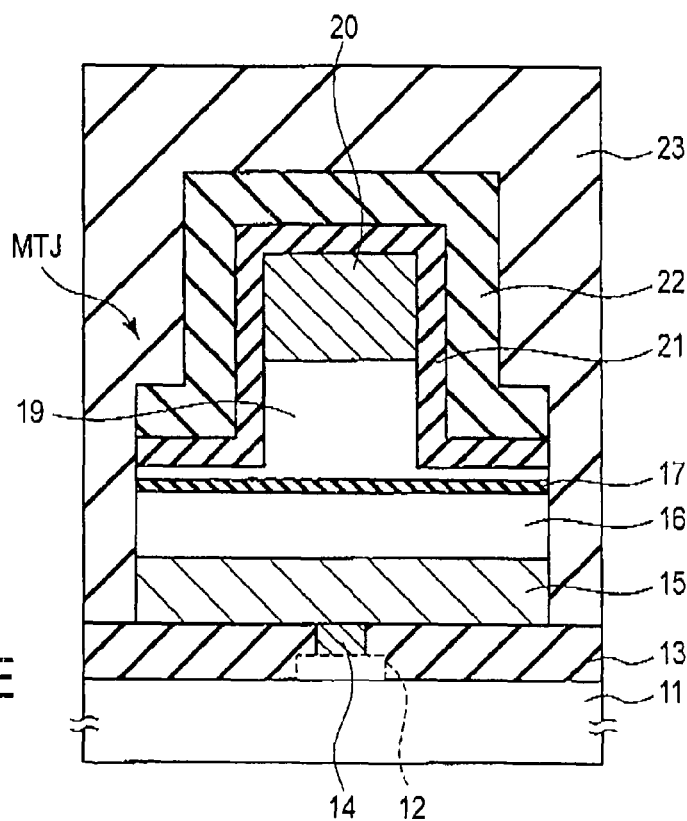

Subsequently, as shown in FIG. 1E, a photoresist layer is formed on insulating layer 22, and thereafter, using the photoresist layer as a mask, insulating layers 21 and 22, magnetism reference layer 19, tunnel barrier layer 17, magnetic recording layer 16, and underlayer 15 are etched by RIE, so that an independent magnetoresistive element MTJ is formed.

Thereafter, inter-layer insulating film 23 covering the magnetoresistive element MTJ is formed. Inter-layer insulating film 23 is, for example, silicon oxide (SiO$_2$) or silicon nitride (SiN). Thereafter, the upper surface of inter-layer insulating film 23 is planarized using the CMP method.

Figure 1F:
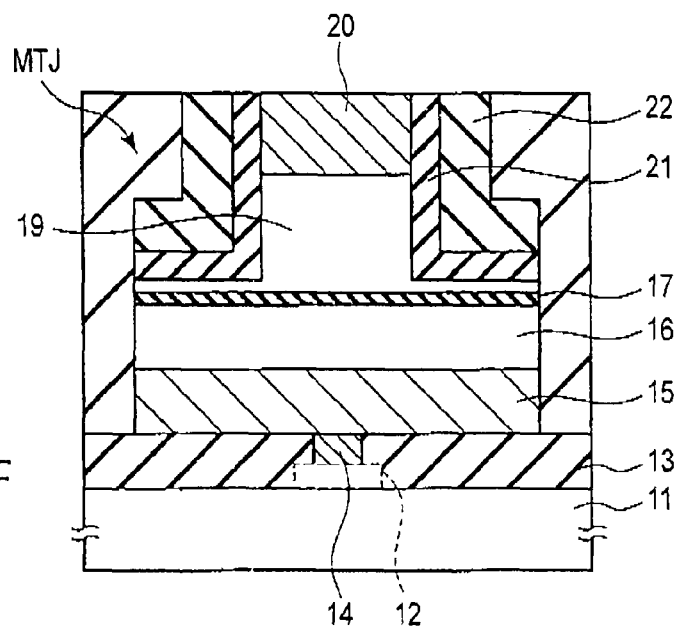

Subsequently, as shown in FIG. 1F, using the CMP method, the upper surface of inter-layer insulating film 23 is continuously ground, so that the upper surface of electrode layer 20 is exposed.

Figure 1G:
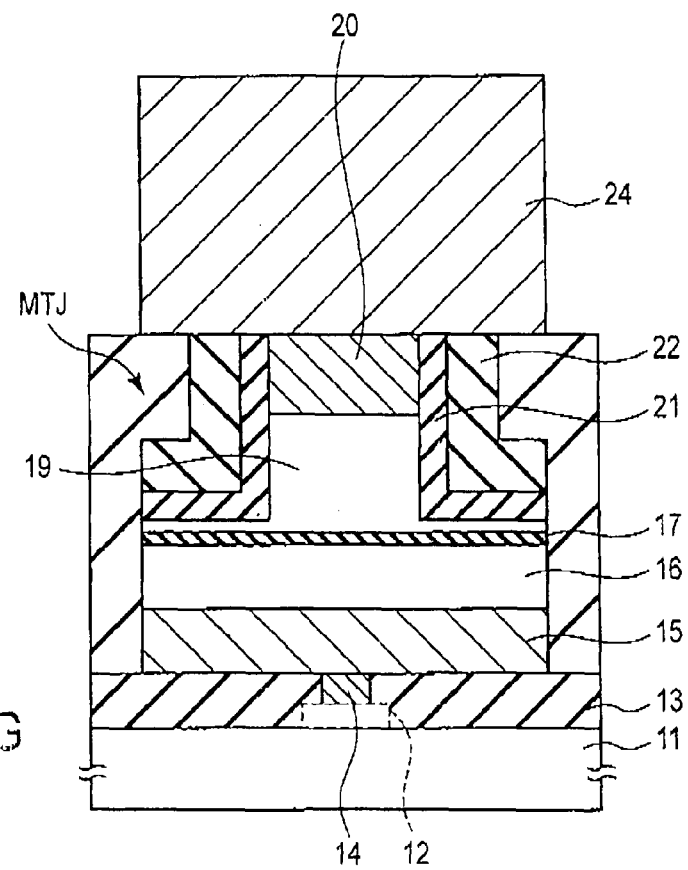

Finally, as shown in FIG. 1G, conductive line 24 connected to electrode layer 20 is formed on inter-layer insulating film 23. Conductive line 24 is, for example, aluminum (Al) or copper (Cu).

When a magnetoresistive element of a magnetic random access memory (MRAM) was made according to the above manufacturing method, we observed that a large value of 100% or more of the MR ratio thereof was attained. In contrast, when CoFeB was crystallized by heating with an oven (at 350° C. for one hour), the MR ratio was 75%.

When the oven was used, a breakdown voltage of the magnetoresistive element was 1.8 V. In contrast, when the GCIB-irradiation was used, it was 2 V.

As described above, according to the first embodiment, the GCIB-irradiation is used instead of heating with an oven and the like, so that the characteristics of the multilayer film can be greatly improved. The above effects were obtained even when one of an Ne cluster, Kr cluster, and Xe cluster was used instead of the Ar cluster.

[Second Embodiment]

This manufacturing method also relates to a method for manufacturing a magnetoresistive element. The second embodiment is different from the first embodiment in the type of cluster used in the GCIB-irradiation.

First, the same steps as those of the first embodiment are executed until a magnetic recording layer and a tunnel barrier layer are formed on a contact plug (see FIG. 1A and FIG. 1B).

For example, as shown in FIG. 2, the magnetic recording layer includes a structure made by laminating six sets of layers including Pd (0.4 nm in thickness) and Co (0.4 nm in thickness), and Ta (0.3 nm in thickness) and CoFeB (1 nm in thickness) on this structure.

For example, the tunnel barrier layer has a body-centered cubic lattice (BCC) structure, and comprises an MgO layer (1 nm in thickness) oriented in the (001) face.

Figure 5:
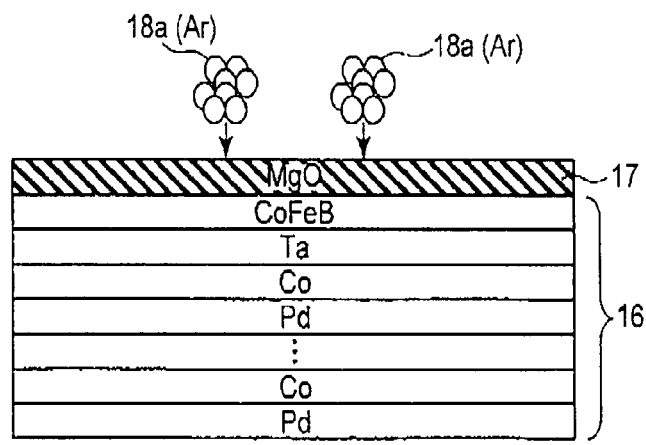
FIGS. 5 to 8 show a manufacturing method of a second embodiment.

Then, as shown in FIG. 5, the first GCIB-irradiation is performed on the surface of the MgO layer serving as the tunnel barrier layer. However, the total number of clusters N is, for example, $5 \times 10^{13}$ cm$^{-2}$, and the average atomic number A of clusters is, for example, 10000. For example, N×A is $5 \times 10^{13}$ cm$^{-2}$.

For example, the cluster used in the GCIB-irradiation is Ar (argon) cluster 18a, and this is ion-beam-irradiated at an acceleration voltage of, for example, 5 kV. At this occasion, the average energy per atom is 0.5 eV.

Figure 6:
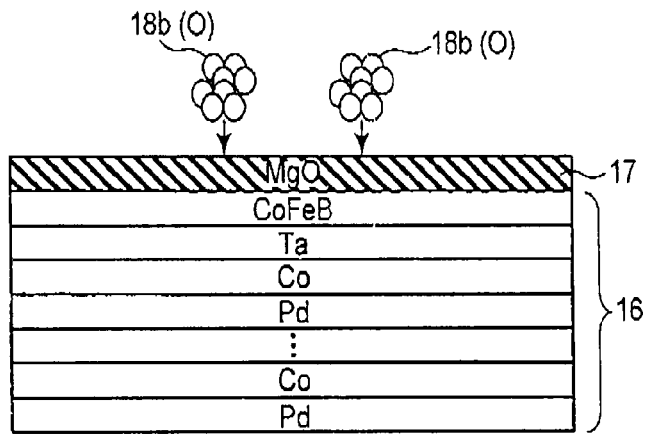

Subsequently, as shown in FIG. 6, the second GCIB-irradiation is performed on the surface of the MgO layer serving as the tunnel barrier layer. However, the total number of clusters N is, for example, $5 \times 10^{13}$ cm$^{-2}$, and the average atomic number A of clusters is, for example, 10000. For example, N×A is $5 \times 10^{17}$ cm$^{-2}$.

For example, the cluster used in the GCIB-irradiation is O (oxygen) cluster 18b, and this is ion-beam-irradiated at an acceleration voltage of, for example, 5 kV. At this occasion, the average energy per atom is 0.5 eV.

When (N×A) values of these two GCIB-irradiations are added, the obtained summation is $1 \times 10^{18}$ cm$^{-2}$, which is equivalent to the value of the first embodiment.

This GCIB-irradiation accelerates crystallization of CoFeB, and as a result, the CoFeB has the same crystal structure as MgO. In other words, for example, CoFeB has the body-centered cubic lattice (BCC) structure, and changes into a crystal structure oriented in the (001) face. Since the CoFeB is in a micro crystallite state or amorphous state before the GCIB-irradiation, it is understood that the crystal information of MgO is transcribed to CoFeB immediately thereunder by this irradiation.

At this occasion, no interdiffusion is observed in a Pd/Co multilayer film.

Further, in this example, an O cluster irradiation is performed after an Ar cluster irradiation. This is because O atoms are easily detached from the surface of the MgO layer which instantly has a high temperature during the Ar cluster irradiation. O atoms detached from the MgO layer by the Ar cluster irradiation are compensated by the O cluster irradiation, so that a composition of the MgO layer can be maintained at an optimum value.

It should be noted that the Ar cluster irradiation and the O cluster irradiation may be performed at the same time. A step including the Ar cluster irradiation and the O cluster irradiation (which may be performed in two steps or at the same time) may be repeatedly performed multiple times.

The GCIB clusters may be not only Ar but also rare gases such as Ne, Kr and Xe. The average atomic number A of atoms constituting a cluster is preferably 500 or more, and further, the energy K per atom is preferably 1 eV or less, so as not to introduce damage to the ion-irradiation face. Further, in order to give an annealing effect, a product (N×A) of the irradiation concentration N of the cluster and the average atomic number A of atoms constituting the cluster is preferably $1 \times 10^{17}$ cm$^{-2}$ or more. However, the effects of the present embodiment can also be achieved by increasing K to more than 1 eV and performing the GCIB-irradiation while generating etching on the film surface. At that occasion, an initial film thickness needs to be thicker than a design value.

Subsequently, like the first embodiment, for example, using a sputtering method, a magnetism reference layer (pinned layer) is formed on the tunnel barrier layer (see FIG. 1C).

Figure 7:
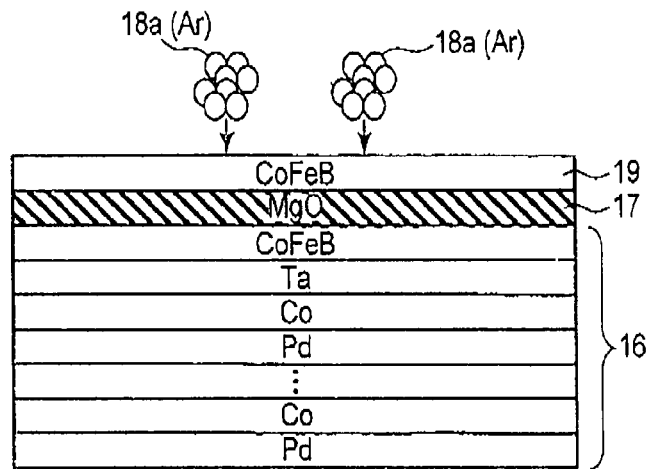

For example, as shown in FIG. 7, the magnetism reference layer has CoFeB (1 nm in thickness).

Further, as shown in FIG. 7, the first GCIB-irradiation is performed on the surface of the CoFeB serving as the magnetism reference layer. However, the total number of clusters N is, for example, $5 \times 10^{13}$ cm$^{-2}$, and the average atomic number A of clusters is, for example, 10000. For example, N×A is $5 \times 10^{17}$ cm$^{-2}$.

For example, the cluster used in the GCIB-irradiation is Ar cluster 18a, and this is ion-beam-irradiated at an acceleration voltage of, for example, 5 kV. At this occasion, the average energy per atom is 0.5 eV.

Figure 8:
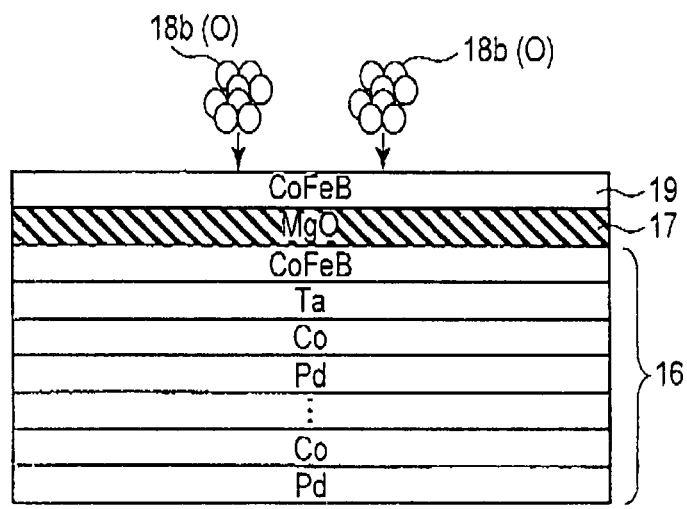

Subsequently, as shown in FIG. 8, the second GCIB-irradiation is performed on the surface of the CoFeB serving as the magnetism reference layer. However, the total number of clusters N is, for example, $5 \times 10^{13}$ cm$^{-2}$, and the average atomic number A of clusters is, for example, 10000. For example, N×A is $5 \times 10^{17}$ cm$^{-2}$.

For example, the cluster used in the GCIB-irradiation is O (oxygen) cluster 18b, and this is ion-beam-irradiated at an acceleration voltage of, for example, 5 kV. At this occasion, the average energy per atom is 0.5 eV.

When (N×A) values of these two GCIB-irradiations are added, the obtained summation is $1 \times 10^{18}$ cm$^{-2}$, which is equivalent to the value of the first embodiment.

This GCIB-irradiation accelerates crystallization of CoFeB, and as a result, the CoFeB has the same crystal structure as MgO. In other words, for example, the CoFeB has the body-centered cubic lattice (BCC) structure, and changes into a crystal structure oriented in the (001) face. Since the CoFeB is in a micro crystallite state or amorphous state before the GCIB-irradiation, it is understood that the crystal information of MgO is transcribed to CoFeB immediately thereabove by this irradiation.

At this occasion, no interdiffusion is observed in the Pd/Co multilayer film, either.

Further, in this example, for the same reason as above, an O cluster irradiation is performed after the Ar cluster irradiation. The Ar cluster irradiation and the O cluster irradiation may be performed at the same time, or a step including the Ar cluster irradiation and the O cluster irradiation (which may be performed in two steps or at the same time) may be repeatedly performed multiple times.

It should be noted that thereafter Ta (4 nm in thickness), Co (4 nm in thickness), and Pt (6 nm in thickness)/Co (4 nm in thickness) may be further laminated as a magnetism reference layer, so that a magnetic bias of the magnetoresistive element may be adjusted.

The steps after this are performed in the same manner as those of the first embodiment, and the magnetic random access memory (MRAM) is formed (see FIG. 1D to FIG. 1G).

Like the first embodiment, when a magnetoresistive element was made according to the above manufacturing method, we observed that a large value of 100% or more of MR ratio thereof was attained. On the other hand, the breakdown voltage of the magnetoresistive element was 2 V.

As described above, according to the second embodiment, the characteristics of the multilayer film can also be greatly improved by using the GCIB-irradiation. The above effects were obtained even when one of an Ne cluster, Kr cluster, and Xe cluster was used instead of the Ar cluster.

[Third Embodiment]

This manufacturing method also relates to a method for manufacturing a magnetoresistive element. The third embodiment is different from the first embodiment in the type of cluster used in the GCIB-irradiation.

First, the same steps as those of the first embodiment are executed until a magnetic recording layer and a tunnel barrier layer are formed on a contact plug (see FIG. 1A and FIG. 1B).

For example, as shown in FIG. 2, a magnetic recording layer includes a structure made by laminating six sets of layers including Pd (0.4 nm in thickness) and Co (0.4 nm in thickness), and Ta (0.3 nm in thickness) and CoFeB (1 nm in thickness) on this structure.

For example, the tunnel barrier layer has a body-centered cubic lattice (BCC) structure, and comprises an MgO layer (1 nm in thickness) oriented in a (001) face.

Figure 9:
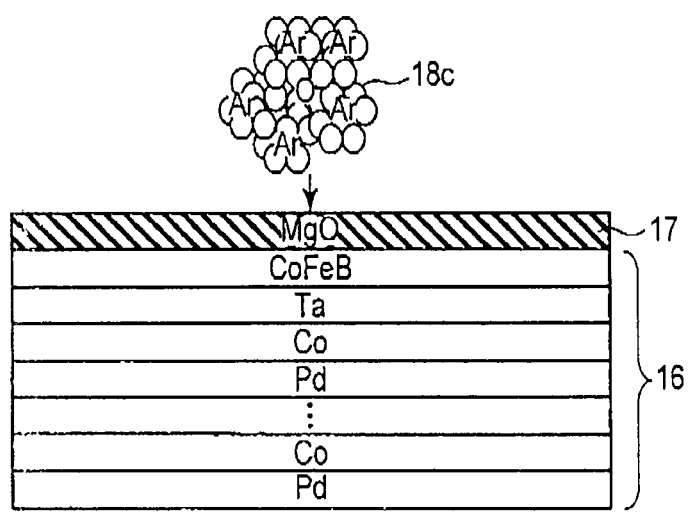
FIGS. 9 and 10 show a manufacturing method of a third embodiment.

Then, as shown in FIG. 9, a GCIB-irradiation is performed on the surface of the MgO layer serving as the tunnel barrier layer. However, the total number of clusters N is, for example, $5 \times 10^{13}$ cm$^{-2}$, and the average atomic number A of clusters is, for example, 20000. For example, N×A is $1 \times 10^{18}$ cm$^{-2}$.

As the cluster used in the GCIB-irradiation, a cluster having a structure in which an O atom is enclosed by Ar atoms is used. For example, a mixed cluster 18c having a structure of one O (oxygen) cluster enclosed by five Ar (argon) clusters is used to perform a GCIB-irradiation at an acceleration voltage of 5 kV. At this occasion, the average energy per atom is 0.25 eV.

This GCIB-irradiation accelerates crystallization of CoFeB, and as a result, the CoFeB has the same crystal structure as MgO. In other words, for example, the CoFeB has the body-centered cubic lattice (BCC) structure, and changes into a crystal structure oriented in a (001) face. Since the CoFeB is in a micro crystallite state or amorphous state before the GCIB-irradiation, it is understood that the crystal information of MgO is transcribed to CoFeB immediately thereunder by this irradiation.

At this occasion, no interdiffusion is observed in a Pd/Co multilayer film.

Further, in this example, the GCIB-irradiation is performed using the mixed cluster having the O cluster enclosed by the Ar clusters. This is to maintain a composition of the MgO layer at an optimum value by compensating O atoms detached from the MgO layer by the GCIB-irradiation using the mixed cluster irradiation including O atoms. When the mixed cluster is used, the temperature of the surface of the MgO layer can locally be higher than the cluster irradiations used in the first and second embodiments, so that O atoms can be provided effectively.

Subsequently, like the first embodiment, for example, using a sputtering method, a magnetism reference layer (pinned layer) is formed on the tunnel barrier layer (see FIG. 1C).

Figure 10:
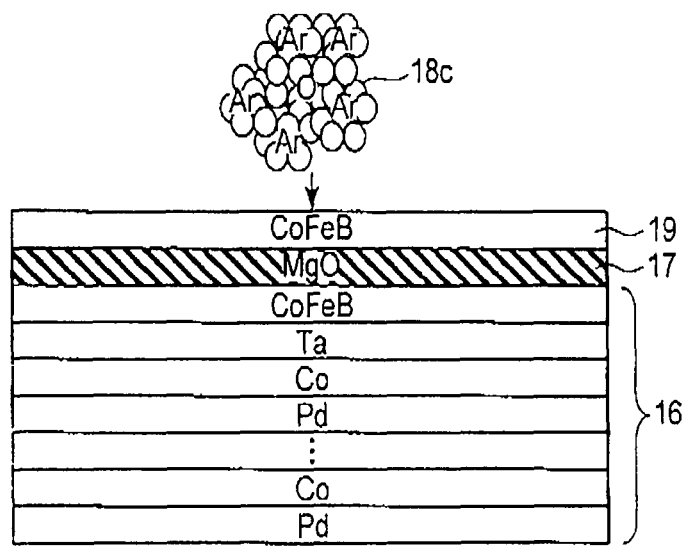

For example, as shown in FIG. 10, the magnetism reference layer has CoFeB (1 nm in thickness).

Further, as shown in FIG. 10, the GCIB-irradiation is performed on the surface of the CoFeB serving as the magnetism reference layer. However, the total number of clusters N is, for example, $5 \times 10^{13}$ cm$^{-2}$, and the average atomic number A of clusters is, for example, 20000. For example, N×A is $1 \times 10^{18}$ cm$^{-2}$.

As the cluster used in the GCIB-irradiation, a cluster having a structure in which an O atom is enclosed by Ar atoms is used. For example, the mixed cluster 18c having a structure of one O (oxygen) cluster enclosed by five Ar (argon) clusters is used to perform the GCIB-irradiation at an acceleration voltage of 5 kV. At this occasion, the average energy per atom is 0.25 eV.

This GCIB-irradiation accelerates crystallization of CoFeB, and as a result, the CoFeB has the same crystal structure as MgO. In other words, for example, the CoFeB has the body-centered cubic lattice (BCC) structure, and changes into the crystal structure oriented in the (001) face. Since the CoFeB is in a micro crystallite state or amorphous state before the GCIB-irradiation, it is understood that the crystal information of MgO is transcribed to CoFeB immediately thereabove by this irradiation.

At this occasion, no interdiffusion is observed in the Pd/Co multilayer film, either.

It should be noted that thereafter Ta (4 nm in thickness), Co (4 nm in thickness), and Pt (6 nm in thickness)/Co (4 nm in thickness) may be further laminated as a magnetism reference layer, so that the magnetic bias of the magnetoresistive element may be adjusted.

The steps after this are performed in the same manner as those of the first embodiment, and the magnetic random access memory (MRAM) is formed (see FIG. 1D to FIG. 1G).

Like the first embodiment, when a magnetoresistive element was made according to the above manufacturing method, we observed that a large value of 100% or more of the MR ratio thereof was attained. On the other hand, the breakdown voltage of the magnetoresistive element was 2 V.

As described above, according to the third embodiment, the characteristics of the multilayer film can also be greatly improved by using the GCIB-irradiation. The above effects were obtained even when one of an Ne cluster, Kr cluster, and Xe cluster was used instead of the Ar cluster as the cluster enclosing the O cluster.

[Fourth Embodiment]

This manufacturing method relates to a method for manufacturing a reproduction magnetic head (TMR head) of an HDD (Hard disk drive). Although this manufacturing method relates to a reproduction magnetic head of an HDD, it should be understood that it can also be applied to a magnetoresistive element.

Figure 11:
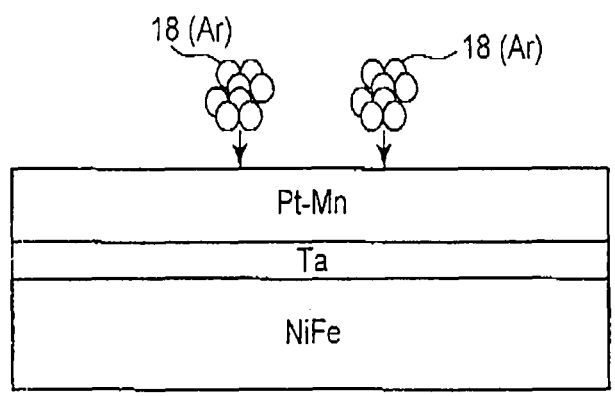
FIGS. 11 to 13 show a manufacturing method of a fourth embodiment.

First, as shown in FIG. 11, a Ta gap layer is formed on a NiFe shield layer. Further, a Pt—Mn layer is formed on the Ta gap layer. The Ta gap layer serves as an underlayer of the Pt—Mn layer.

Thereafter, a GCIB-irradiation is performed on the surface of the Pt—Mn layer. One of the methods explained in the above first to third embodiments can be used in this GCIB-irradiation. In this explanation, use of an Ar cluster (corresponding to the first embodiment) will be explained.

That is, for example, the clusters used in the GCIB-irradiation are Ar clusters 18, and they are ion-beam-irradiated at an acceleration voltage of, for example, 5 kV. The total number of Ar clusters N is, for example, $5 \times 10^{13}$ cm$^{-2}$, and the average atomic number A of clusters is, for example, 10000. For example, N×A is $5 \times 10^{17}$ cm$^{-2}$. At this occasion, the average energy per atom is 0.5 eV.

This GCIB-irradiation accelerates crystallization of the Pt—Mn layer, and for example, the Pt—Mn layer has a face-centered-tetragonal (FCT) structure, and changes into a crystal structure oriented in a (111) face.

Figure 12:
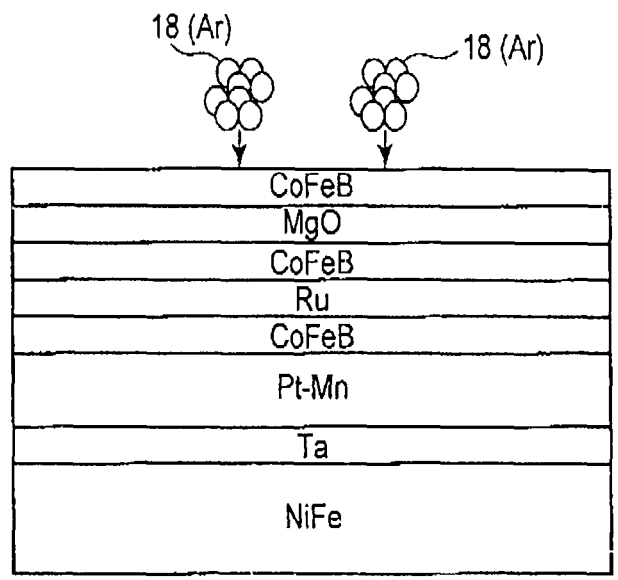

Subsequently, as shown in FIG. 12, a CoFe layer (1.5 nm), an Ru layer (1 nm), a CoFeB layer (1.5 nm), an MgO layer (1 nm) and a CoFeB layer (1 nm) are successively formed on the Pt—Mn layer.

Thereafter, the GCIB-irradiation is performed on the surface of the CoFeB layer.

The clusters used in the GCIB-irradiation are Ar clusters 18, and they are ion-beam-irradiated at an acceleration voltage of, for example, 5 kV. The total number of Ar clusters N is, for example, $1 \times 10^{14}$ cm$^{-2}$, and the average atomic number A of clusters is, for example, 20000. For example, N×A is $2 \times 10^{18}$ cm$^{-2}$. At this occasion, the average energy per atom is 0.4 eV.

This GCIB-irradiation accelerates crystallization of each of the CoFeB layers above and below the MgO layer, and as a result, the CoFeB layers have the same crystal structure as the MgO layer. In other words, for example, the CoFeB layer has the body-centered cubic lattice (BCC) structure, and changes into the crystal structure oriented in a (001) face. Since the CoFeB layer is in a micro crystallite state or amorphous state before the GCIB-irradiation, it is understood that the crystal information of the MgO layer is transcribed to the CoFeB layers above and below the MgO layer by this irradiation at the same time.

At this occasion, no interdiffusion is observed in the multilayer film immediately under the CoFeB.

The technique for transcribing the crystal information of the MgO layer to the CoFeB layers above and below the MgO layer at the same time can also be applied to the magnetoresistive elements explained in the above first to third embodiments. Further, the methods of the above first to third embodiments may be applied to the GCIB-irradiation used in the method for manufacturing the reproduction magnetic head according to this example.

Figure 13:
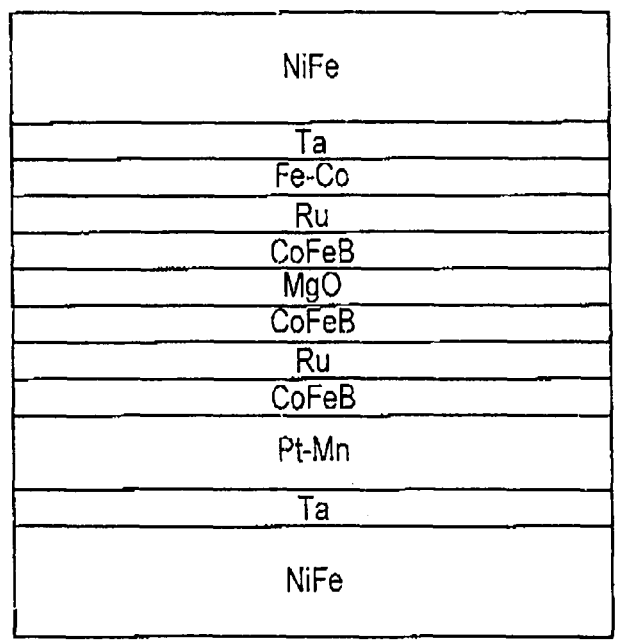

Subsequently, as shown in FIG. 13, an Ru layer (1 nm), an Fe—CO layer (1 nm), and a Ta layer (3 nm) are successively formed on the CoFeB layer. Subsequently, an NiFe shield layer is formed on the Ta layer.

When the reproduction magnetic head of the HDD was made according to the above manufacturing method, we observed that a large value of 100% or more of MR ratio thereof was attained. In contrast, a conventional manufacturing method requires an annealing process at 270° C. or more for crystallization of the Pt—Mn layer, and requires an annealing process at 300° C. or more for crystallization of the CoFeB layer. In this case, Mn atoms in the Pt—Mn layer are diffused, which deteriorates vertical bias characteristics.

Like this example, crystallization of the Pt—Mn layer and the CoFeB layer can be accelerated locally by using the GCIB-irradiation, and this improves yields due to a large process window, and further reduces manufacturing costs.

[Conclusion]

According to the embodiments, lattice vibration is applied to only a particular layer within the multilayer films to suppress interdiffusion within the multilayer film, and as a result, the characteristics of the multilayer film can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a multilayer film, the method comprising:
    forming a first magnetic layer;
    forming a second magnetic layer on the first magnetic layer;
    forming a MgO layer on the second magnetic layer; and
    changing a crystal structure of the second magnetic layer to a BCC (body centered cubic lattice) structure oriented in a (001) face without changing a crystal structure of the first magnetic layer by executing a GCIB-irradiation to the MgO layer,
    wherein each of the second magnetic layer and the MgO layer has a thickness of 10 nm or less, and
    an energy per atom of clusters using the GCIB-irradiation is 1 eV or less.

2. The method of claim 1,
    wherein the GCIB-irradiation is executed by using a gas which includes one of Ne, Ar, Kr and Xe.

3. The method of claim 1,
    wherein the GCIB-irradiation is executed by using a cluster with a structure in which O-elements are surrounded by Ne-elements, Ar-elements, Kr-elements or Xe-elements.

4. The method of claim 1,
    wherein the GCIB-irradiation comprises a first irradiation and a second irradiation after the first irradiation, the first irradiation is executed by using a cluster including Ne-elements, Ar-elements, Kr-elements or Xe-elements, and the second irradiation is executed by using a cluster including O-elements.

5. The method of claim 1,
    wherein A is 500 or more, and $N \times A > 1 \times 10^{17}$ cm$^{-2}$,
    where N is a total number of clusters using the GCIB-irradiation, and A is an average atomic number of the clusters.

6. A method of manufacturing a multilayer film, the method comprising:
    forming a first magnetic layer;
    forming a MgO layer on the first magnetic layer;
    forming a second magnetic layer on the MgO layer; and
    changing a crystal structure of the second magnetic layer to a BCC (body centered cubic lattice) structure oriented in a (001) face without changing a crystal structure of the first magnetic layer by executing a GCIB-irradiation to the second magnetic layer,
    wherein each of the second magnetic layer and the MgO layer has a thickness of 10 nm or less, and
    an energy per atom of clusters using the GCIB-irradiation is 1 eV or less.

7. The method of claim 6,
    wherein the GCIB-irradiation is executed by using a gas which includes one of Ne, Ar, Kr and Xe.

8. The method of claim 6,
    wherein A is 500 or more, and $N \times A > 1 \times 10^{17}$ cm$^{-2}$,
    where N is a total number of clusters using the GCIB-irradiation, and A is an average atomic number of the clusters.

9. A method of manufacturing a magnetoresistive element, the method comprising:
    forming a first magnetic layer;
    forming a second magnetic layer on the first magnetic layer;
    forming a MgO layer on the second magnetic layer;
    changing a crystal structure of the second magnetic layer to a BCC (body centered cubic lattice) structure oriented in a (001) face without changing a crystal structure of the first magnetic layer by executing a first GCIB-irradiation to the MgO layer;
    forming a third magnetic layer on the MgO layer; and
    changing a crystal structure of the third magnetic layer to a BCC structure oriented in a (001) face without changing crystal structures of the first and second magnetic layers by executing a second GCIB-irradiation to the third magnetic layer,
    wherein each of the second and third magnetic layers and the MgO layer has a thickness of 10 nm or less, and an energy per atom of clusters using each of the first and second GCIB-irradiations is 1 eV or less.

10. The method of claim 9,
    wherein the first and second GCIB-irradiations are executed by using a gas which includes one of Ne, Ar, Kr and Xe.

11. The method of claim 9,
    wherein the first GCIB-irradiation is executed by using a cluster with a structure in which O-elements are surrounded by Ne-elements, Ar-elements, Kr-elements or Xe-elements.

12. The method of claim 9,
    wherein the first GCIB-irradiation comprises a first irradiation and a second irradiation after the first irradiation, the first irradiation is executed by using a cluster including Ne-elements, Ar-elements, Kr-elements or Xe-elements, and the second irradiation is executed by using a cluster including O-elements.

13. The method of claim 9,
    wherein A is 500 or more, and $N \times A > 1 \times 10^{17}$ cm$^{-2}$,
    where N is a total number of clusters using one of the first and second GCIB-irradiations, and A is an average atomic number of the clusters.

14. A method of manufacturing a magnetoresistive element, the method comprising:
    forming a first magnetic layer;
    forming a second magnetic layer on the first magnetic layer;
    forming a MgO layer on the second magnetic layer;
    forming a third magnetic layer on the MgO layer; and
    changing crystal structures of the second and third magnetic layers each to a BCC (body centered cubic lattice) structure oriented in a (001) face without changing a crystal structure of the first magnetic layer by executing a GCIB-irradiation to the third magnetic layer, wherein each of the second and third magnetic layers and the MgO layer has a thickness of 10 nm or less, and an energy per atom of clusters using the GCIB-irradiation is 1 eV or less.

15. The method of claim 14, wherein the GCIB-irradiation is executed by using a gas which includes one of Ne, Ar, Kr and Xe.

16. The method of claim 14, wherein A is 500 or more, and $N \times A > 1 \times 10^{17}$ cm$^{-2}$, where N is a total number of clusters using the GCIB-irradiation, and A is an average atomic number of the clusters.

17. The method of claim 1, wherein the first magnetic layer has no interdiffusion while executing the GCIB-irradiation.

18. The method of claim 6, wherein the first magnetic layer has no interdiffusion while executing the GCIB-irradiation.

19. The method of claim 9, wherein the first magnetic layer has no interdiffusion while executing the first GCIB-irradiation, and each of the first and second magnetic layers has no interdiffusion while executing the second GCIB-irradiation.

20. The method of claim 14, wherein the first magnetic layer has no interdiffusion while executing the GCIB-irradiation.

21. The method of claim 1, wherein the first magnetic layer includes a multilayer film with magnetic layers laminated with each other.

22. The method of claim 6, wherein the first magnetic layer includes a multilayer film with magnetic layers laminated with each other.

23. The method of claim 9, wherein the first magnetic layer includes a multilayer film with magnetic layers laminated with each other.

24. The method of claim 14, wherein the first magnetic layer includes a multilayer film with magnetic layers laminated with each other.

* * * * *